(12) United States Patent
Bains (10) Patent No.: US 9,721,641 B2
(45) Date of Patent: Aug. 1, 2017

(54) APPARATUS, METHOD AND SYSTEM FOR MEMORY DEVICE ACCESS WITH A MULTI-CYCLE COMMAND

(71) Applicant: Intel Corporation, Santa Clara, CA (US)

(72) Inventor: Kuljit S. Bains, Olympia, WA (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 14/440,064

(22) PCT Filed: Nov. 22, 2013

(86) PCT No.: PCT/US2013/071534
§ 371 (c)(1),
(2) Date: Apr. 30, 2015

(87) PCT Pub. No.: WO2014/085268
PCT Pub. Date: Jun. 5, 2014

(65) Prior Publication Data
US 2015/0317096 A1 Nov. 5, 2015

Related U.S. Application Data

(60) Provisional application No. 61/731,908, filed on Nov. 30, 2012.

(51) Int. Cl.
*G06F 13/00* (2006.01)
*G11C 11/4074* (2006.01)
(Continued)

(52) U.S. Cl.
CPC ........ *G11C 11/4074* (2013.01); *G06F 3/0604* (2013.01); *G06F 3/0637* (2013.01);
(Continued)

(58) Field of Classification Search
CPC G06C 11/4074; G06C 11/708; G06C 7/1057; G06C 7/1072; G06C 7/1084;
(Continued)

(56) References Cited

U.S. PATENT DOCUMENTS 6,031,757 A * 2/2000 Chuang ................. G11C 16/22
365/185.04
6,393,504 B1 * 5/2002 Leung ..................... G06F 13/40
710/104

(Continued)

OTHER PUBLICATIONS

International Preliminary Report on Patentability for International Application No. PCT/US2013/071534 mailed Jun. 11, 2015, 6 pgs.
"PCT, International Search Report and Written Opinion of the International Searching Authority for International Application No. PCT/US2013/071534", (Mar. 13, 2014), Whole Document.

*Primary Examiner* — Reba I Elmore
(74) *Attorney, Agent, or Firm* — Blakely, Sokoloff, Taylor & Zafman LLP (57) ABSTRACT

Techniques and mechanisms for determining a timing of a command to access a memory device resource. In an embodiment, a multi-cycle command which is exchanged from a memory controller to a memory device, wherein the multi-cycle command indicates an access to a bank of the memory device. Timing of the one or more other commands is controlled, based on the multi-cycle command, to enforce a time delay parameter which describes an operational constraint of the memory device. In another embodiment, timing of one or more commands is determined with reference to a beginning of a last cycle of a multi-cycle command.

22 Claims, 8 Drawing Sheets (51) Int. Cl.
- *G06F 3/06* (2006.01)
- *G11C 7/10* (2006.01)
- *G11C 8/06* (2006.01)
- *G06F 13/16* (2006.01)
- *G11C 11/408* (2006.01)

(52) U.S. Cl.
CPC ........ *G06F 3/0673* (2013.01); *G06F 13/1663* (2013.01); *G11C 7/109* (2013.01); *G11C 7/1057* (2013.01); *G11C 7/1072* (2013.01); *G11C 7/1084* (2013.01); *G11C 8/06* (2013.01); *G11C 11/408* (2013.01); *Y10T 29/41* (2015.01)

(58) Field of Classification Search
CPC ....... G06C 7/108; G06C 11/06; G06F 3/0604; G06F 3/0637; G06F 3/0673; G06F 13/1663
USPC ................ 711/154, 167; 712/202, 221, 225; 365/189.16, 230.03
See application file for complete search history.

(56) References Cited

U.S. PATENT DOCUMENTS

| | | |
|---|---|---|
| 2002/0156985 A1 | 10/2002 | Abhyankar et al. |
| 2005/0108469 A1 | 5/2005 | Freeman et al. |
| 2006/0171236 A1 | 8/2006 | Atwood et al. |
| 2008/0091920 A1 | 4/2008 | Shaw et al. |
| 2009/0024790 A1* | 1/2009 | Rajan .................. G11C 11/4063 711/105 |
| 2009/0204771 A1* | 8/2009 | Kawamoto ......... G06F 13/1663 711/151 |
| 2009/0228687 A1* | 9/2009 | Hosoki .................. G06F 9/325 712/206 |
| 2011/0235459 A1* | 9/2011 | Ware ........................ G11C 7/04 365/233.11 |
| 2012/0140581 A1* | 6/2012 | Roy ..................... G11C 7/1015 365/189.16 |
| 2015/0089164 A1* | 3/2015 | Ware ........................ G11C 5/02 711/149 |

* cited by examiner

| SDRAM Command | SDR Command Pins | | SDR CA pins (6) | | | | | |
|---|---|---|---|---|---|---|---|---|
| | CKE | | CS_N | CA0 | CA1 | CA2 | CA3 | CA4 | CA5 |
| | CK_T(n-1) | CK_T(n) | | | | | | | |
| MRW | H | H | L | L | L | L | L | MA0 | MA1 |
| | | | H | MA2 | MA3 | MA4 | MA5 | MA6 | MA7 |
| | | | H | OP0 | OP1 | OP2 | OP3 | OP4 | OP5 |
| | | | H | OP6 | OP7 | V | | | |
| MRR | H | H | L | L | L | L | H | MA0 | MA1 |
| | | | H | MA2 | MA3 | MA4 | MA5 | MA6 | MA7 |
| Refresh (per Bank) | H | H | L | L | L | H | L | BA0 | BA1 |
| | | | H | BA2 | V | | | | |
| Refresh (all Bank) | H | H | L | L | L | H | H | V | |
| | | | H | V | | | | | |
| Self Refresh Entry | H | L | L | L | L | H | V | | |
| | L | L | X | X | | | | | |
| Activate | H | H | L | L | H | R0 | R1 | BA0 | BA1 |
| | | | H | BA2 | R2 | R3 | R4 | R5 | R6 |
| | | | H | R7 | R8 | R9 | R10 | R11 | R12 |
| | | | H | R13 | R14 | R15 | RFU | RFU | RFU |
| Write | H | H | L | H | L | L | AP | BA0 | BA1 |
| | | | H | BA2 | C2 | C3 | C4 | C5 | C6 |
| | | | H | C7 | C8 | C9 | RFU | RFU | RFU |
| | | | H | | | | | | |
| Read | H | H | L | H | L | H | AP | BA0 | BA1 |
| | | | H | BA2 | C2 | C3 | C4 | C5 | C6 |
| | | | H | C7 | C8 | C9 | RFU | RFU | RFU |
| | | | H | V | | | | | |
| PreCharge (per Bank, all Banks) | H | H | L | H | H | L | H | BA0 | BA1 |
| | | | H | BA2 | AB | V | | | |
| Enter Deep PD | H | L | L | H | H | L | V | | |
| | L | L | H | X | | | | | |
| NOP | H | H | L | H | H | H | V | | |
| | | | H | V | | | | | |
| Maintain PD, SREF, DPD (NOP) | L | L | L | H | H | H | V | | |
| | | | H | X | | | | | |
| NOP | H | H | H | V | | | | | |
| | | | H | V | | | | | |
| Maintain PD, SREF, DPD (NOP) | L | L | H | X | | | | | |
| | | | H | X | | | | | |
| Enter PD | H | L | H | V | | | | | |
| | L | L | H | X | | | | | |
| Exit PD, SREF, DPD | L | H | H | V | | | | | |
| | H | | H | V | | | | | |

APPARATUS, METHOD AND SYSTEM FOR MEMORY DEVICE ACCESS WITH A MULTI-CYCLE COMMAND

CROSS-REFERENCE TO RELATED APPLICATIONS

This application is a U.S. National Phase of International Patent Application No. PCT/US2013/071534, filed Nov. 22, 2013, entitled "APPARATUS, METHOD AND SYSTEM FOR MEMORY DEVICE ACCESS WITH A MULTI-CYCLE COMMAND," which claims the benefit of priority from U.S. Provisional Patent Application No. 61/731,908 filed Nov. 30, 2012, both contents of which are incorporated herein by reference in their entireties.

BACKGROUND

1. Technical Field

The present invention relates to memory devices and, more particularly, to accessing memory cells of a volatile memory device.

2. Background Art

Computing systems generally rely on memory devices to store information. Such memory devices may be divided into two general types. First, volatile memory devices which require power to maintain correctness of the stored information. Second, non-volatile memory devices which maintain the stored information even after power is cut off.

One common type of volatile memory device is Dynamic Random Access Memory (DRAM). DRAM devices generally provide significantly improved performance over mechanical storage devices (such as hard disks), while providing lower cost, higher storage densities and less power consumption in comparison to other memory technologies, including and most notably, static random access memory (SRAM) devices. However, these benefits come at the cost of incurring various delays in accessing the memory cells making up a DRAM device, both at regular intervals, and in the time periods immediately before and after each access to either read data from the memory cells or to write data to the memory cells.

DRAMs generally store each bit of data in a separate capacitor within an integrated circuit. Since capacitors leak charge, the information eventually fades unless the capacitor charge is refreshed periodically. Because of this refresh requirement and other design considerations, DRAMs designers impose various timing constraints on operations within a DRAM to maintain correctness. One such constraint is a precharge requirement. In particular, when access is requested to a different row (also referred to as a Bit Line (BL)) in a DRAM, the current row has to be first deactivated by issuing a "precharge" command. The precharge command will cause the sense amplifiers to switch off and the bit lines to be precharged to matching voltages that are intermediate between high and low logic levels. After a certain row precharge time period delay (also referred to as tRP), an "activate" command may be issued to activate the next row to be accessed.

It is refresh operations, precharge operations, activate operations as well as other maintenance operations that impose the various delays that are suffered as a result of employing DRAM technology. These delays have the effect of limiting the rate at which data may be written to or read from DRAM devices, and although components such as processors have made great strides in becoming ever faster, comparatively little progress has been made in increasing the rate of accesses for DRAM technology.

BRIEF DESCRIPTION OF THE DRAWINGS

The various embodiments of the present invention are illustrated by way of example, and not by way of limitation, in the figures of the accompanying drawings and in which.

DETAILED DESCRIPTION

Embodiments discussed herein variously provide techniques and/or mechanisms for controlling a timing of one or more commands to access memory resources. Such controlling may be based on another multi-cycle command which is exchanged from a memory controller to a memory device, wherein the multi-cycle command indicates an access to a bank of the memory device. Timing of the one or more other commands may be controlled to enforce a time delay parameter which describes an operational constraint of the memory device. In an embodiment, timing of the one or more other commands may be determined with reference to a beginning of a last cycle of the multi-cycle command.

Figure 1:
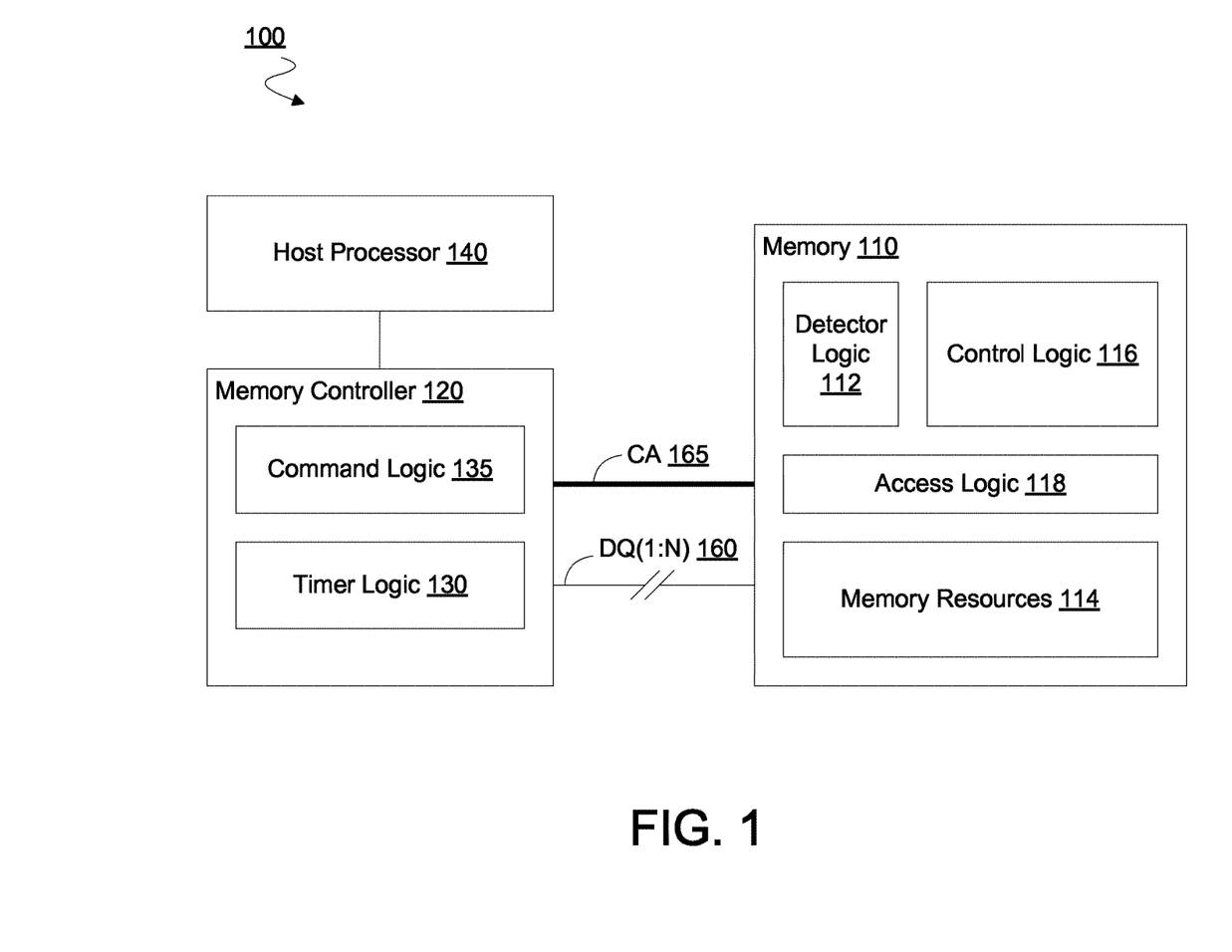
FIG. 1 is a block diagram illustrating elements of a system for exchanging a multi-cycle command according to an embodiment.

FIG. 1 illustrates elements of a system 100 for exchanging command and address information according to an embodiment. System 100 may include memory device 110 coupled to memory controller 120—e.g. where memory controller 120 is to provide access to memory device 110 for a host processor 140 which is included in or coupled to system 100.

Memory device 110 may include any of a variety of types of memory technology that, for example, have rows of memory cells, where data is accessible via a wordline or the equivalent. In one embodiment, memory device 110 includes dynamic random access memory (DRAM) technology. Memory device 110 may be an integrated circuit package within a larger memory device (not shown) of system 100. For example, memory device 110 may be a DRAM device of a memory module such as a dual in-line memory module (DIMM).

Memory device 110 may include memory resources 114, which represent one or more logical and/or physical groups of memory. An example of one such grouping of memory is a bank of memory resources which, for example, may include an array of storage elements arranged in rows and columns. Memory device 110 may include access logic 118 to facilitate, at least in part, access to memory resources 114—e.g. where such access is provided for servicing one or more commands from memory controller 120. Access logic 118 may include, or operate in conjunction with, logic of memory device 110 which provides resource access according to conventional techniques—e.g. where functionality of detector logic 112, control logic 116 and/or access logic 118 supplements such conventional techniques with additional functionality discussed herein. By way of illustration and not limitation, access logic 118 may include or couple to column logic and/or row logic (not shown) which are used to decode an access instruction to the proper memory location within memory resources 114.

Memory controller 120 may send commands or instructions to memory device 110 over a one or more buses, as represented by the illustrative command/address (CA) bus 165. Such commands may be interpreted by memory device 110—e.g. including memory device 110 decoding command information to perform a variety of access functions within the memory and/or decoding address information with column logic and/or row logic. For example, such logic may access a specific location in memory resources 114 with a combination of a column address strobe or signal (CAS) and a row address strobe or signal (RAS). Rows of memory may be implemented in accordance with known memory architectures or their derivatives. Briefly, a row of memory resources 114 may include one or more addressable columns of memory cells, as identified by the CAS generated by column logic of memory 110. The rows may each be variously addressable via the RAS generated by row logic of memory 110.

Access to memory resources 114 may be for the purpose of writing data exchanged—and/or reading data to be exchanged—via a data bus coupled to I/O circuitry (not shown) of memory 110. For example, N data bus signal lines DQ(1:N) 160 may couple I/O circuitry 112 to memory controller 120 and/or one or more other memory devices (not shown).

In an embodiment, memory controller 120 includes command logic 135—e.g. including any of a variety of hardware logic and/or executing software logic—to send commands via CA 165. Command logic 135 may include or couple to logic of memory controller which performs operations to generate, transmit or otherwise determine commands sent according to one or more conventional techniques. By way of illustration and not limitation, command logic 135 may supplement otherwise conventional command/address signaling functionality which, for example, conforms to some or all requirements of a dual data rate (DDR) specification such as the DDR3 SDRAM JEDEC Standard JESD79-3C, April 2008 or the like. For example, memory controller 120 may include timer logic 130 comprising circuitry and/or executing software configured to control timing for an assertion (e.g. sending) of a command by command logic 135. Timer logic 130 may control such timing to enforce one or more time delay parameters required for operation of memory 110.

In an embodiment, command logic 135 includes, maintains and/or otherwise has access to storage (not shown) for data concerning the status of various rows within memory 110. Such data may provide an indication of which of banks have open rows—e.g. where such data includes addresses of those open rows. Command logic 135 (and/or other logic of memory controller 120) may access such data to determine whether or not a row to be accessed in a given banks of memory device 110 is already open, and if not, whether or not a different row in the same bank is already open. If the row to be accessed is determined to already be open, then the access may be carried out without the transmission of a row activate command. However, if the row to be accessed is determined to not already be open, then command logic 135 may transmit to memory device 110 an activate command (e.g. a row activate command) which includes a value specifying whether a bank targeted by the command includes a row which is currently open. Such a value (referred to herein as hint information) may indicate to the memory device 110 that it is to internally generate its own command to perform a precharge operation to close the currently open row—e.g. independent of memory device 110 receiving any explicit command to perform such precharge operation.

Alternatively or in addition, memory device 110 may include detector logic 112 to evaluate some or all of a command received via CA 165—e.g. to determine that a command is to be generated internally by memory device 110. By way of illustration and not limitation, detector logic 112 may determine whether a command is targeting a bank which include a page which is currently open. The targeting of such a bank is referred to as a "page miss event" (or, for brevity, simply a "page miss"). In response to detector logic 112 identifying a page miss event corresponding to a command received via CA 165, control logic 116 may perform operations to prepare for accessing of memory resources targeted by the command. As discussed herein, such operations may include memory device 110 internally generating signaling which are to function in the place of one or more commands received from memory controller 120. For example, memory 110 may provide to access logic 118 signals which are functionally equivalent in one or more respects with a precharge command. Accordingly, access logic 118 may perform operations to precharge a row (or rows) of memory resources 114 independent of memory 110 receiving any explicit command specifying such precharge operations.

Figure 2:
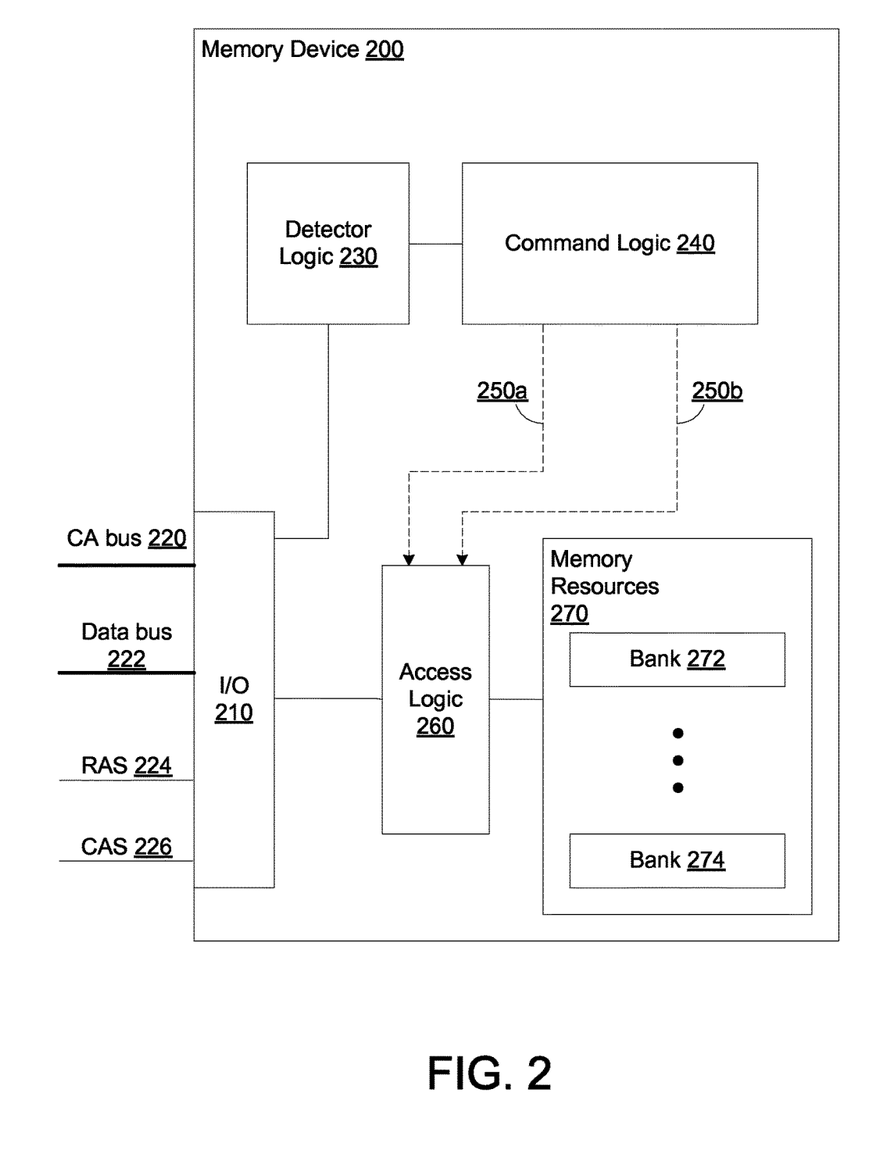
FIG. 2 is a block diagram illustrating elements of a memory device for processing a multi-cycle command according to an embodiment.

FIG. 2 illustrates elements of a memory device 200 according to an embodiment for processing a multi-cycle command received from a memory controller. Memory device 200 may operate in conjunction with a memory controller such as memory controller 120. For example, memory device 200 may include one or more features of memory device 110. Although certain embodiments are not limited in this regard, memory device 200 may support LPDDR 4 and/or any of a variety of standards for double-data-rate standard memory operation.

In an embodiment, memory device 200 includes access logic 260 and memory resources 270 which, for example, provide some or all of the respective functionality of access logic 118 and memory resources 114. Memory device 200 may further comprise an input/output (I/O) 210 to couple memory device 200 to some or all of a command address bus 220, a data bus 225 a row address strobe signal line RAS 224, a column address strobe signal line CAS 226.

Memory device 200 may receive via I/O 210 command information and/or address information which, for example, a memory controller (not shown) sends via CA bus 220. Such command/address information may be sent over a plurality of cycles of a clock signal (for example, a CA bus clock signal) to facilitate an access to some or all of a plurality of banks 272, . . . , 274 of memory resources 270. By way of illustration and not limitation, such command/address information may include commands which are to transition memory device 200 from a state which is for providing access to one row of bank 272 to another state which, for example, is for providing access to another row of bank 272, a row of bank 274, or the like. Such a transition may include precharging a row of bank 272 and performing one of an activation of another row of bank 272 and a refresh of the other row of bank 272. Activation of such banks may be in preparation of performing a write of data exchanged (and/or a read of data to be exchanged) via data bus 222.

In an embodiment, detector logic 230 receives or otherwise detects some or all of a multi-cycle command received via CA bus 220 and, based thereon, identifies a page miss event associated with the multi-cycle command. Such identification of a page miss event may be based on the multi-cycle command including hint information specifying whether a bank includes a row which is currently open.

In response to a detected page miss event, control logic 240 may internally generate a precharge command 250a to send to access logic 260. Alternatively or in addition, command logic 240 may generate a command 250b to perform an activation operation or refresh operation indicated by the multi-cycle command received via CA bus 220. Assertion of either or both of commands 250a, 250b may be timed by command logic 240 to enforce one or more predetermined time delay parameters.

Figure 3:
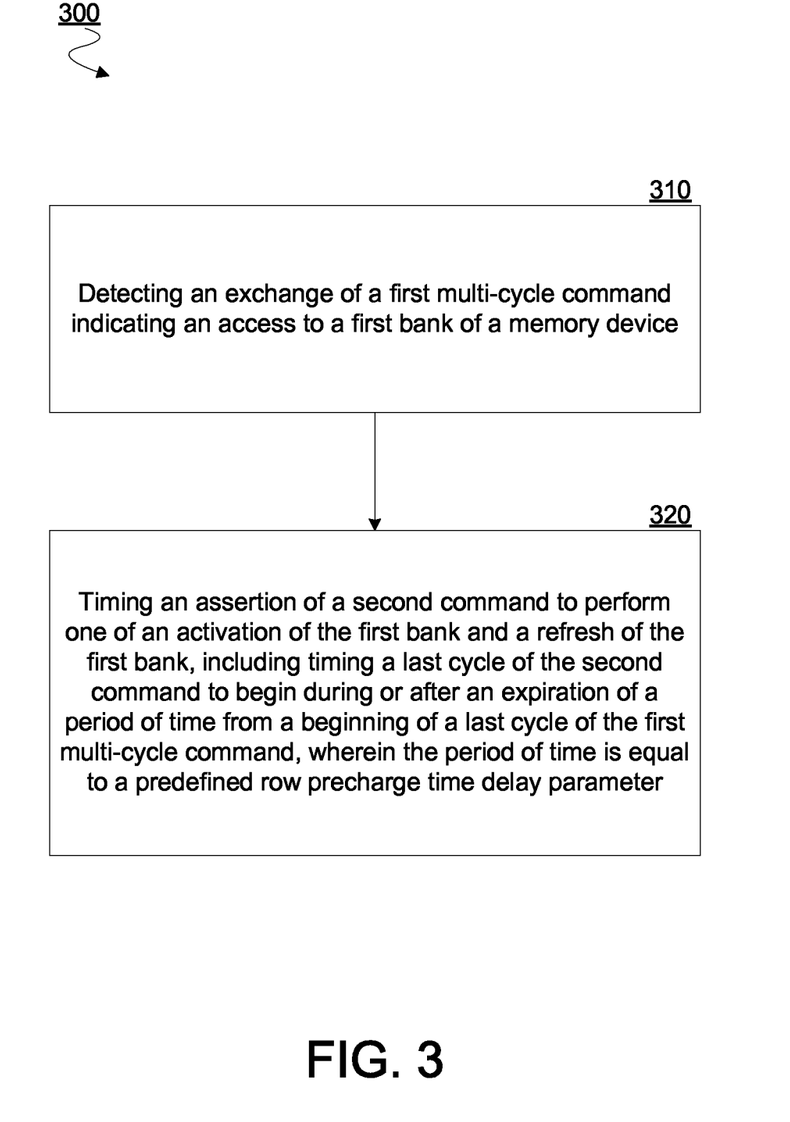
FIG. 3 is a flow diagram illustrating elements of a method for timing a command to access a memory resource according to an embodiment.

FIG. 3 illustrates elements of a method 300 for determining an assertion of a command to access a memory resource according to an embodiment. In one embodiment, method 300 is performed by a memory device such as one including some or all of the features of memory 100. For example, method 300 may be performed by memory device 200. In another embodiment, memory device is performed by a memory controller such as one providing some or all of the functionality of memory controller 120.

Method 300 may include, at 310, detecting an exchange of a first multi-cycle command indicating an access to a first bank of the memory device. The first multi-cycle command may be exchanged from a memory controller to the memory device. The exchange may detected at 310 by the memory device—e.g. wherein first multi-cycle command is one of an activation command and a refresh command. Alternatively, the detecting at 310 may include timer logic 130 or similar logic of a memory controller detecting that the memory controller has, will be or is sending the first multi-cycle command to a memory device.

Based on the exchange detected at 310, method 300 may further perform, at 320, timing an assertion of a second command to perform one of an activation of the first bank and a refresh of the first bank. Assertion of the second command may take place during one or more cycles of a clock signal such as a CA bus clock signal. In an embodiment, the timing at 320 includes timing a last cycle of the second command for a last sampling of the second command to begin during or after an expiration of a period of time from a beginning of a last cycle of the first multi-cycle command, wherein the period of time is equal to a predefined row precharge time delay parameter. For example, the last cycle of the second command may be timed for the last sampling of the second command (which may, for example, also be a first sampling of the second command) to coincide with an earliest cycle of the clock signal to begin during or after the expiration of the period of time. By way of illustration and not limitation, the second command may be a multi-cycle command—e.g. wherein a total number of cycles of the first multi-cycle command is different than a total number of cycles of the second command.

The timing of the assertion at 320 may include identifying a reference value representing a time of the beginning of the last cycle of the first multi-cycle command. A start time for the assertion of the second command may then be determined by adding to the reference time value a difference between the predefined row precharge time delay parameter and a duration of all cycles of the second command other than the last cycle.

In an embodiment where the detecting at 310 is performed at a memory device, method 300 may perform other operations (not shown) for the internal generation of a command by the memory device—e.g. independent of a memory controller explicitly sending such a command to the memory device. For example, in response to detection of the exchange at 310, the memory device may generate a precharge command prior to the second command. Such a precharge command may be generated, for example, in response to a hint value of the first multi-cycle command, the hint value specifying whether the first bank includes a row which is currently open. The memory device may time an assertion of such a precharge command for a last sampling (which may, for example, also be a first sampling) of the precharge command to start at the beginning of the last cycle of the first multi-cycle command.

In an embodiment where the detecting at 310 is performed at a memory controller, other operations (not shown) of method 300 may include timing an assertion of a multi-cycle column address strobe signal to the memory device subsequent to the second command. Such a timing may include, for example, timing a last cycle of the multi-cycle column address strobe signal to begin during or after an expiration of a period of time which starts at a beginning of the last cycle of the second command. For example, the last cycle of the multi-cycle column address strobe signal may be timed to coincide with an earliest cycle of the clock signal which begins during or after the expiration of the period of time. The period of time may be equal, for example to a tRCD time delay parameter. In conventional DRAM architectures, the a tRCD parameter specifies a required delay between an assertion of a row address strobe signal and an assertion of an associated column address strobe signal.

Figure 4:
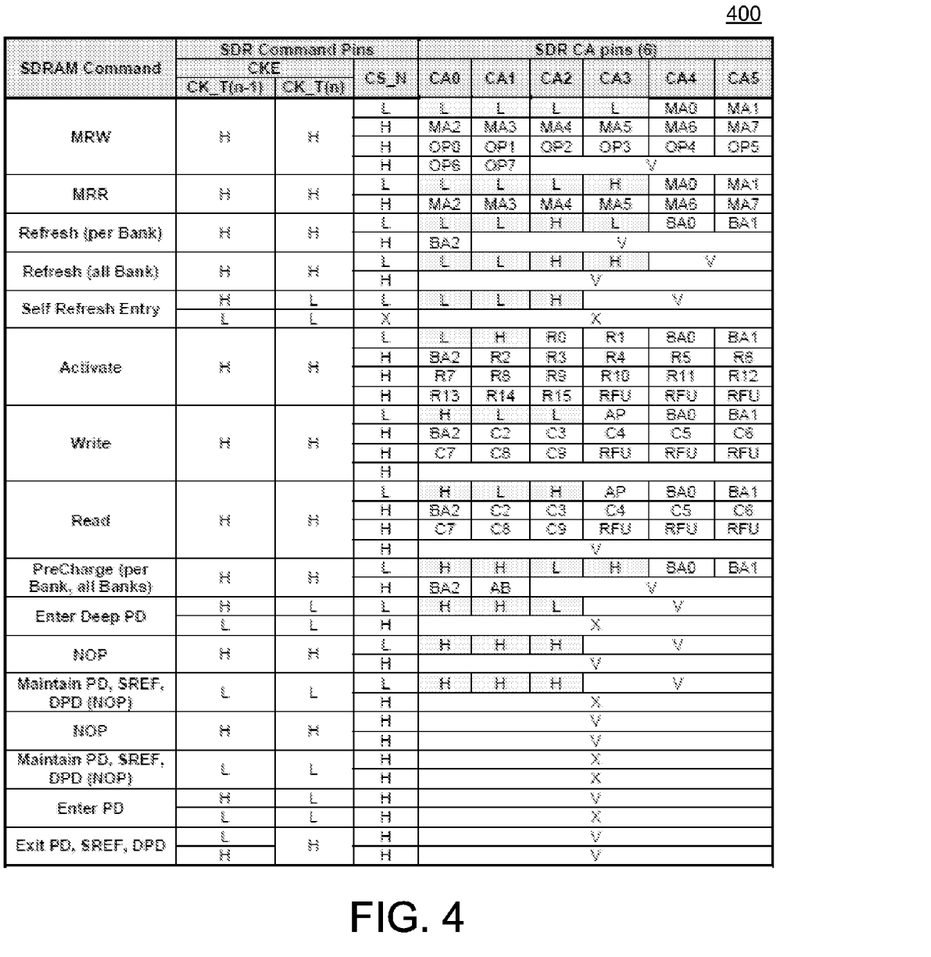
FIG. 4 is a table illustrating multi-cycle commands which are exchanged between a memory controller and a memory device according to an embodiment.

FIG. 4 is an embodiment of a truth table for commands exchanged between a memory controller and a memory device according to an embodiment. Command truth table 400 represents one example of a truth table which includes multi-cycle commands. As used herein, "multi-cycle command" refers to a command which is exchanged over the course of a plurality of cycles of a clock signal which regulates such an exchange. For example, different portions of a multi-cycle command may each be sent during a different respective cycle of such a plurality of cycles.

In table 400, the column to the left identifies supported synchronous dynamic random access memory (SDRAM) commands. The columns to the right identify the value of different signals to specify the identified command. Of particular note in table 400 are the four-cycle Activate command, the two-cycle PreCharge command and the two Refresh commands (per Bank and all Bank, respectively) which are each two-cycle. Individual commands are shown in table 400 as variously including one or more of MA# bits to represent mode register address information, OP# bits to represent opcode information for a mode register operation, BA# bits to represent bank address information, R# bits to represent row address information, C# bits to represent column address information and an AB bit to represent whether a command is to apply to all banks. The "X" values in table 400 represent "Don't Care" states which need not be driven to any valid logical state. By contrast, the "V" values in table 400 represent "Don't Care" states which do need to be driven to some valid logical state.

FIGS. 5A through 5D variously illustrate features of command signal exchanges, according to different embodiments, which include some or all of the features discussed herein. In the illustrative embodiments represented in FIGS. 5A through 5D, the sampling of commands—e.g. including the respective sampling of different cycles of a multi-cycle commands—takes place on a rising edge of a command-address (CA) bus. However, certain embodiments are not limited in this regard.

Figure 5A:
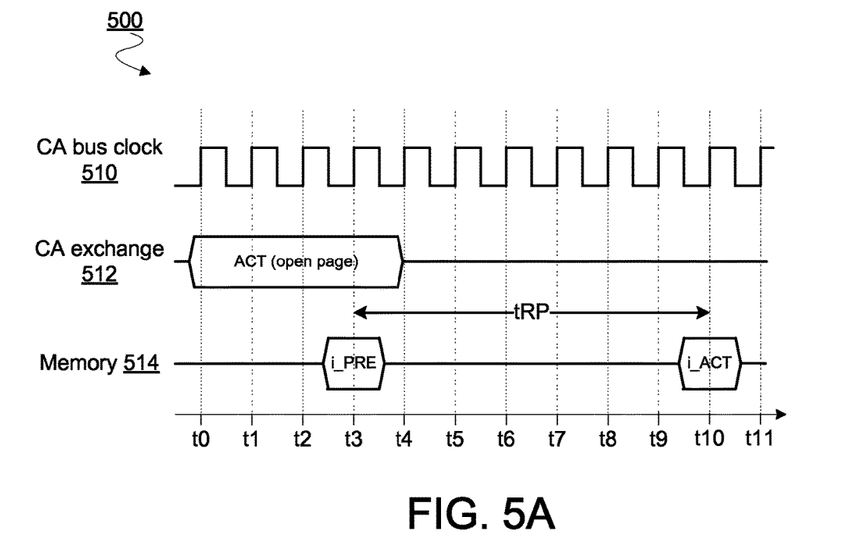
FIGS. 5A through 5D are timing diagrams illustrating features of various multi-cycle command exchanges according to respective embodiments.

FIG. 5A is a timing diagram 500 illustrating a timing of commands to access memory resources according to an embodiment. Timing diagram 500 may represent exchanges and operations performed in system 100, for example. Timing diagram 500 shows a CA exchange 512 sent from a memory controller to a memory 514 via a command address bus. In the example embodiment represented in timing diagram 500, timing of exchanges via the command address bus are regulated by, or otherwise correspond to, a CA bus clock 510. Timing diagram 500 further shows operations of a memory 514 in response to CA exchange 512.

In an embodiment, CA exchange 512 includes a multi-cycle activate (ACT) command which includes a hint value indicating a page miss event. For example, the hint value may specify to the memory device that a bank target by the ACT command includes a row which is currently open. In response to the ACT command of CA exchange 512, memory 514 may internally generate a precharge command i_PRE to precharge and close the currently open row indicated by the hint value. Subsequently, memory 514 may generate an activate command i_ACT to perform the activate operation indicated by the ACT command of CA exchange 512.

In an embodiment, memory 514 times the generating of i_PRE and/or the generating of i_ACT to enforce a time delay parameter tRP which specifies a required delay between a precharge and an associated row activation operation. By way of illustration and not limitation, memory 514 may perform timing control operations to assure that a sampling of a last cycle of i_ACT (which in this example is the only cycle of i_ACT) is no earlier than an expiration of a time period equal to tRP after a beginning of a last cycle of the ACT command of CA exchange 512. Additionally or alternatively, memory 514 may perform timing control operations to assure that a beginning of a last cycle of i_PRE (which in this example is the only cycle of i_PRE) coincides with a beginning of a last cycle of the ACT command of CA exchange 512.

Figure 5B:
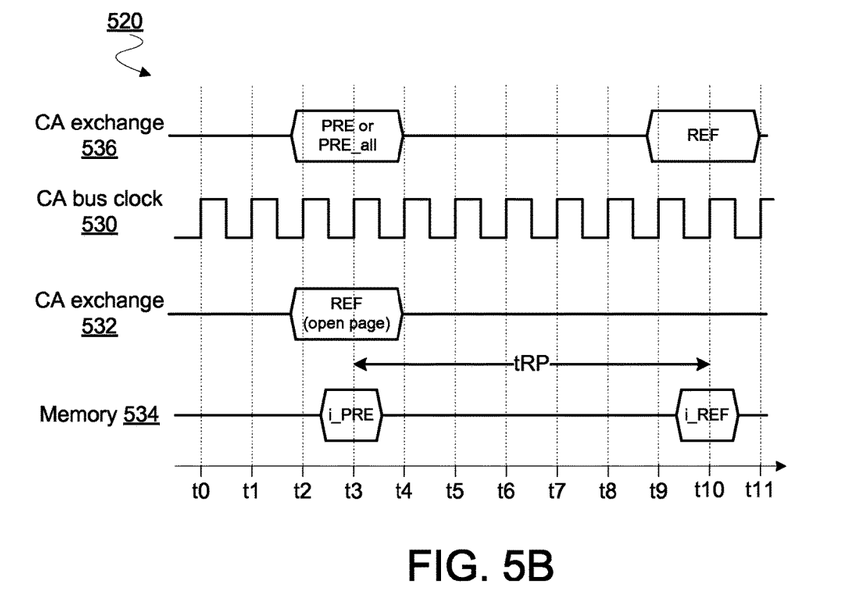

FIG. 5B is a timing diagram 520 illustrating a timing of commands to access memory resources according to an embodiment. Timing diagram 520 may represent exchanges and operations performed in system 100, for example. Timing diagram 520 shows a CA exchange 532 sent from a memory controller to a memory 534 via a command address bus. In the example embodiment represented in timing diagram 520, timing of exchanges via the command address bus are regulated by, or otherwise correspond to, a CA bus clock 530. Timing diagram 520 further shows operations of a memory 534 in response to CA exchange 532.

Timing diagram 520 is similar in some respects to timing diagram 500, with a notable difference being that a hint value indicating a page miss event is included in a multi-cycle refresh (REF) command of CA exchange 532. In response to the REF command of CA exchange 532, memory 534 may internally generate a precharge command i_PRE—e.g. independent of any explicit precharge command of CA exchange 532. Subsequently, memory 534 may generate a refresh command i_REF to perform the refresh operation indicated by the REF command of CA exchange 532.

Similar to memory 514, memory 534 may time the generating of i_PRE and/or the generating of i_REF to enforce the parameter tRP. By way of illustration and not limitation, memory 534 may perform timing control operations to assure that a sampling of a last cycle of i_REF is no earlier than an expiration of a time period, equal to tRP, which begins with a last cycle of the REF command of CA exchange 532. Additionally or alternatively, memory 534 may perform timing control operations to assure that a sampling of a last cycle of i_PRE) coincides with a beginning of a last cycle of the REF command of CA exchange 532.

Timing diagram 520 further illustrates an enforcement of a tRP parameter by a memory controller according to another embodiment. More particularly, timing diagram 520 further shows a CA exchange 536 of two multi-cycle commands from a memory controller to a memory device. For comparison purposes only, CA exchange 536 is shown as being concurrent with CA exchange 532, although certain embodiments are not limited in this regard. For example, CA exchange 536 may be an exchange by a different memory controller than that for CA exchange 532 or may be a later (or earlier) portion of CA exchange 532.

CA exchange 536 includes one of a per-bank precharge command (PRE) and an all-bank precharge (PRE_all), as well as a subsequent REF command. To enforce the tRP delay parameter with respect to such commands, the memory controller may include functionality, such as that of timer logic 130, to assure that a last sampling of the REF command is no earlier than an expiration of a time period, equal to tRP, which begins with a last cycle of the PRE (or PRE_all) command of CA exchange 536. This timing control may be determined with reference to the beginning of the last cycle of the PRE (or PRE_all) command—e.g. as opposed to being determined with reference to the beginning of the first cycle of the PRE (or PRE_all) command. This distinction becomes more apparent when considering multi-cycle commands of different length, as shown in FIG. 5C, for example.

Figure 5C:
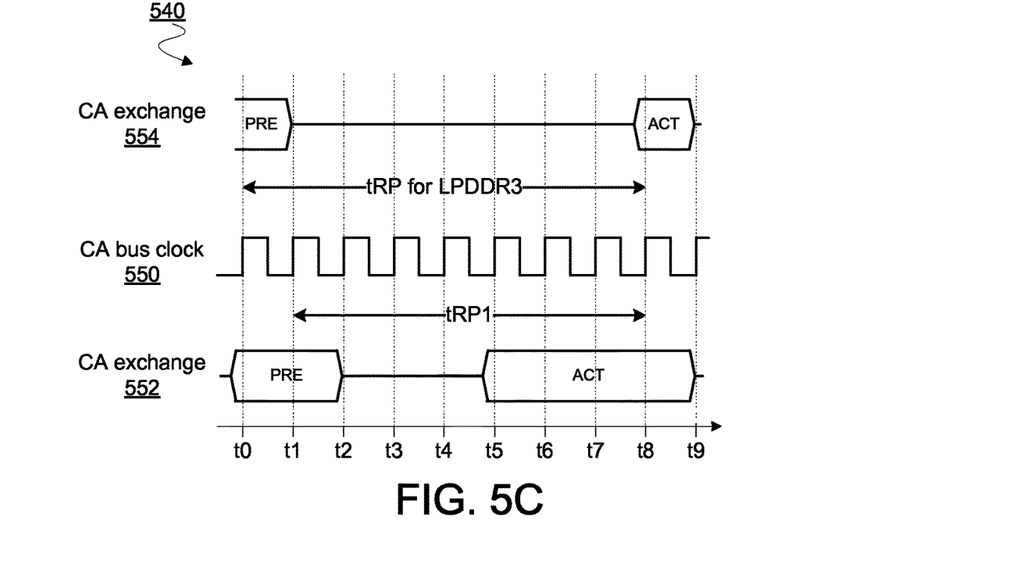

FIG. 5C is a timing diagram 540 illustrating a timing of commands to access memory resources according to an embodiment. Timing diagram 540 may represent exchanges and operations performed in system 100, for example. Timing diagram 540 shows a CA exchange 552 sent from a memory controller to a memory via a command address bus. The timing of CA exchange 552 may be regulated by, or otherwise correspond to, a CA bus clock 550.

CA exchange 552 includes a PRE and a subsequent ACT command. To enforce a tRP1 delay parameter with respect to such commands, the memory controller may perform timing control operations to assure that a sampling of a last cycle of the ACT command is no earlier than an expiration of a time period, equal to tRP1, which begins with a sampling of a last cycle of the PRE command of CA exchange 552.

It is particularly notable that a time difference (t6−t0) between a respective beginnings of the PRE command and the ACT commands is less than tRP1. Accordingly, using the beginnings of such commands to timing to enforcing the tRP1 requirement with reference to the respective beginnings of the PRE command and the ACT command would require that ACT command be started only at t7 of timing diagram 540. By contrast, the embodiment illustrated in FIG. 5C allows the ACT command to start at t5. An example of the alternative approach is shown for comparison purposes with a CA exchange 554. A PRE command and an ACT command of CA exchange 554 may be sent, for example, by a memory controller which operates according to LPDDR3. In CA exchange 554, a tRP delay is enforced with reference to the respective beginnings of the PRE command and the ACT command.

Figure 5D:
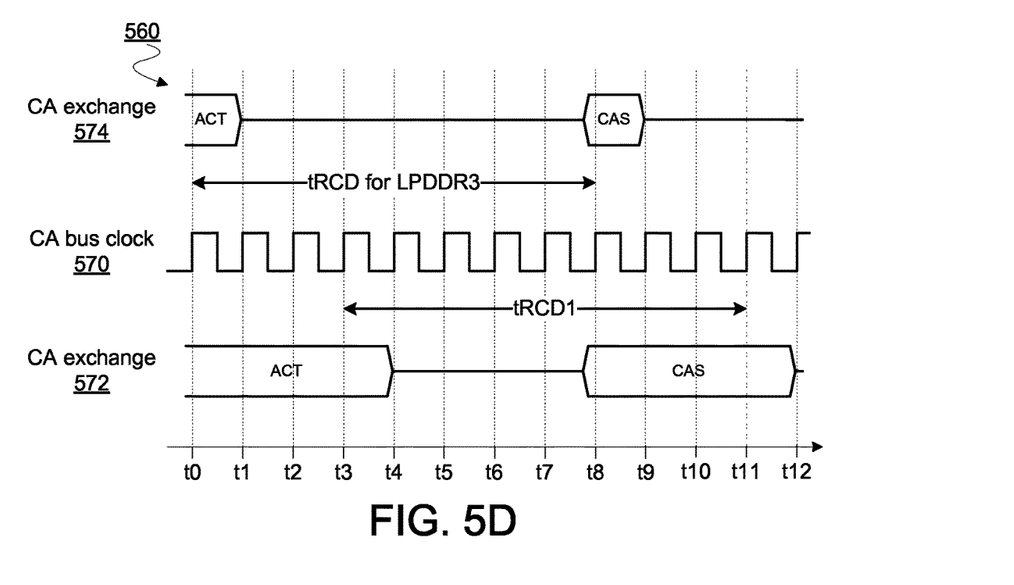

FIG. 5D is a timing diagram 560 illustrating a timing of commands to access memory resources according to an embodiment. Timing diagram 560 may represent exchanges and operations performed in system 100, for example. Timing diagram 560 shows a CA exchange 572 sent from a memory controller to a memory via a command address bus. The timing of CA exchange 572 may be regulated by, or otherwise correspond to, a CA bus clock 570.

CA exchange 572 includes an ACT command and a subsequent command address strobe (CAS) signal. Operation of the memory device may be constrained or otherwise characterized by a delay parameter tRCD1 which specifies a minimum time between a row activation command and an associated column address strobe. To enforce a tRCD1 delay parameter with respect to the ACT command and the CAS signal of CA exchange 572, the memory controller may perform timing control operations to assure that a sampling of a last cycle of the ACT command is no earlier than an expiration of a time period, equal to tRCD1, which begins with a sampling of a last cycle of the CAS signal of CA exchange 572. For comparison purposes only, timing diagram 560 also shows a timing of a CA exchange 574, according to conventional LPDDR3 techniques, to enforce a similar tRCD delay parameter.

Figure 6:
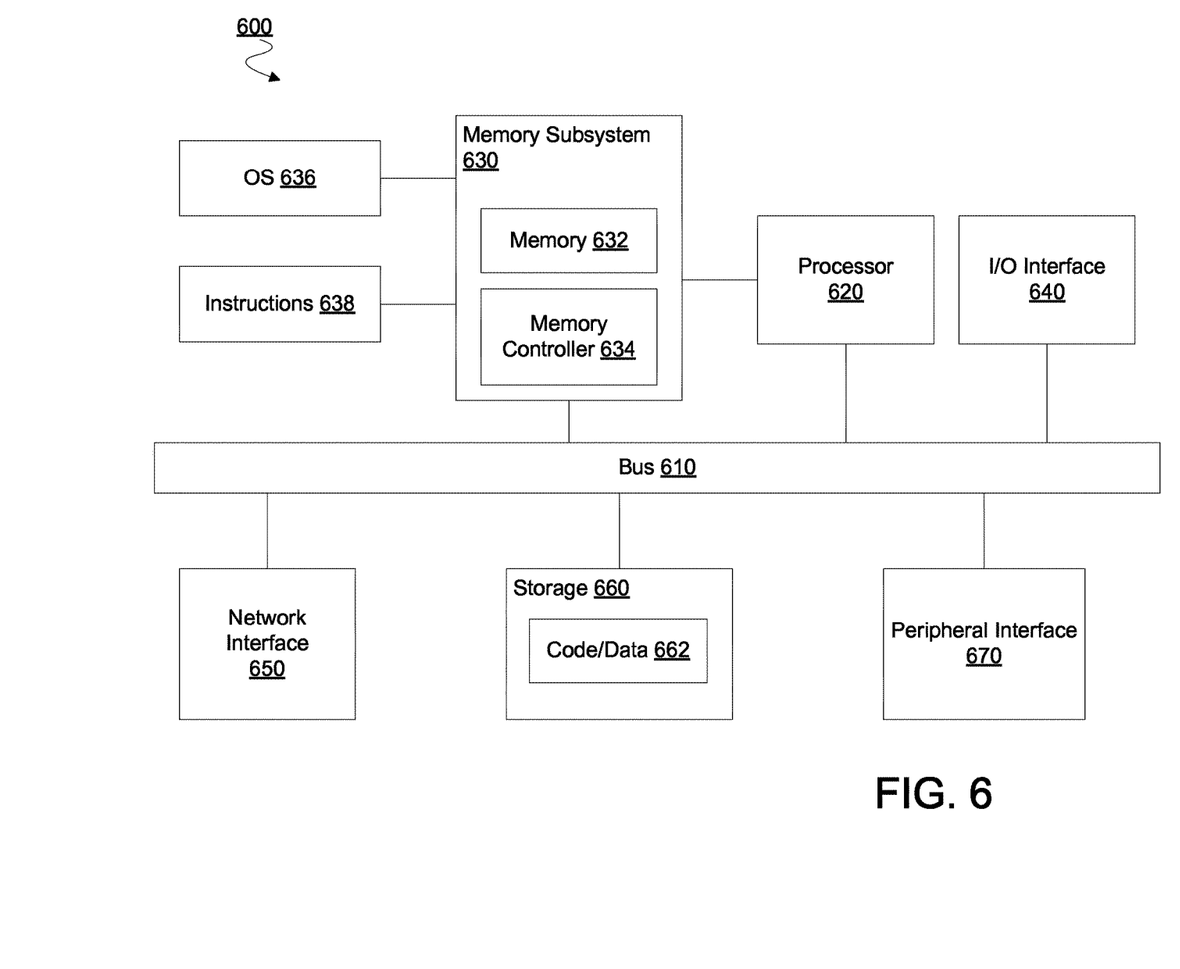
FIG. 6 is a block diagram illustrating elements of a computing system for accessing memory resources according to an embodiment.

FIG. 6 is a block diagram of an embodiment of a computing system in which memory accesses may be implemented. System 600 represents a computing device in accordance with any embodiment described herein, and may be a laptop computer, a desktop computer, a server, a gaming or entertainment control system, a scanner, copier, printer, or other electronic device. System 600 may include processor 620, which provides processing, operation management, and execution of instructions for system 600. Processor 620 may include any type of microprocessor, central processing unit (CPU), processing core, or other processing hardware to provide processing for system 600. Processor 620 controls the overall operation of system 600, and may be or include, one or more programmable general-purpose or special-purpose microprocessors, digital signal processors (DSPs), programmable controllers, application specific integrated circuits (ASICs), programmable logic devices (PLDs), or the like, or a combination of such devices.

Memory subsystem 630 represents the main memory of system 600, and provides temporary storage for code to be executed by processor 620, or data values to be used in executing a routine. Memory subsystem 630 may include one or more memory devices such as read-only memory (ROM), flash memory, one or more varieties of random access memory (RAM), or other memory devices, or a combination of such devices. Memory subsystem 630 stores and hosts, among other things, operating system (OS) 636 to provide a software platform for execution of instructions in system 600. Additionally, other instructions 638 are stored and executed from memory subsystem 630 to provide the logic and the processing of system 600. OS 636 and instructions 638 are executed by processor 620.

Memory subsystem 630 may include memory device 632 where it stores data, instructions, programs, or other items. In one embodiment, memory subsystem includes memory controller 634, which is a memory controller in accordance with any embodiment described herein, and which provides mechanisms for accessing memory device 632. In one embodiment, memory controller 634 provides commands to memory device 632. The commands may cause memory device 632 to internally generate activate commands and/or precharge commands for memory resources.

Processor 620 and memory subsystem 630 are coupled to bus/bus system 610. Bus 610 is an abstraction that represents any one or more separate physical buses, communication lines/interfaces, and/or point-to-point connections, connected by appropriate bridges, adapters, and/or controllers. Therefore, bus 610 may include, for example, one or more of a system bus, a Peripheral Component Interconnect (PCI) bus, a HyperTransport or industry standard architecture (ISA) bus, a small computer system interface (SCSI) bus, a universal serial bus (USB), or an Institute of Electrical and Electronics Engineers (IEEE) standard 1394 bus (commonly referred to as "Firewire"). The buses of bus 610 may also correspond to interfaces in network interface 650.

System 600 may also include one or more input/output (I/O) interface(s) 640, network interface 650, one or more internal mass storage device(s) 660, and peripheral interface 670 coupled to bus 610. I/O interface 640 may include one or more interface components through which a user interacts with system 600 (e.g., video, audio, and/or alphanumeric interfacing). Network interface 650 provides system 600 the ability to communicate with remote devices (e.g., servers, other computing devices) over one or more networks. Network interface 650 may include an Ethernet adapter, wireless interconnection components, USB (universal serial bus), or other wired or wireless standards-based or proprietary interfaces.

Storage 660 may be or include any conventional medium for storing large amounts of data in a nonvolatile manner, such as one or more magnetic, solid state, or optical based disks, or a combination. Storage 660 holds code or instructions and data 662 in a persistent state (i.e., the value is retained despite interruption of power to system 600). Storage 660 may be generically considered to be a "memory," although memory 630 is the executing or operating memory to provide instructions to processor 620. Whereas storage 660 is nonvolatile, memory 630 may include volatile memory (i.e., the value or state of the data is indeterminate if power is interrupted to system 600).

Peripheral interface 670 may include any hardware interface not specifically mentioned above. Peripherals refer generally to devices that connect dependently to system 600. A dependent connection is one where system 600 provides the software and/or hardware platform on which an operation executes, and with which a user interacts.

Figure 7:
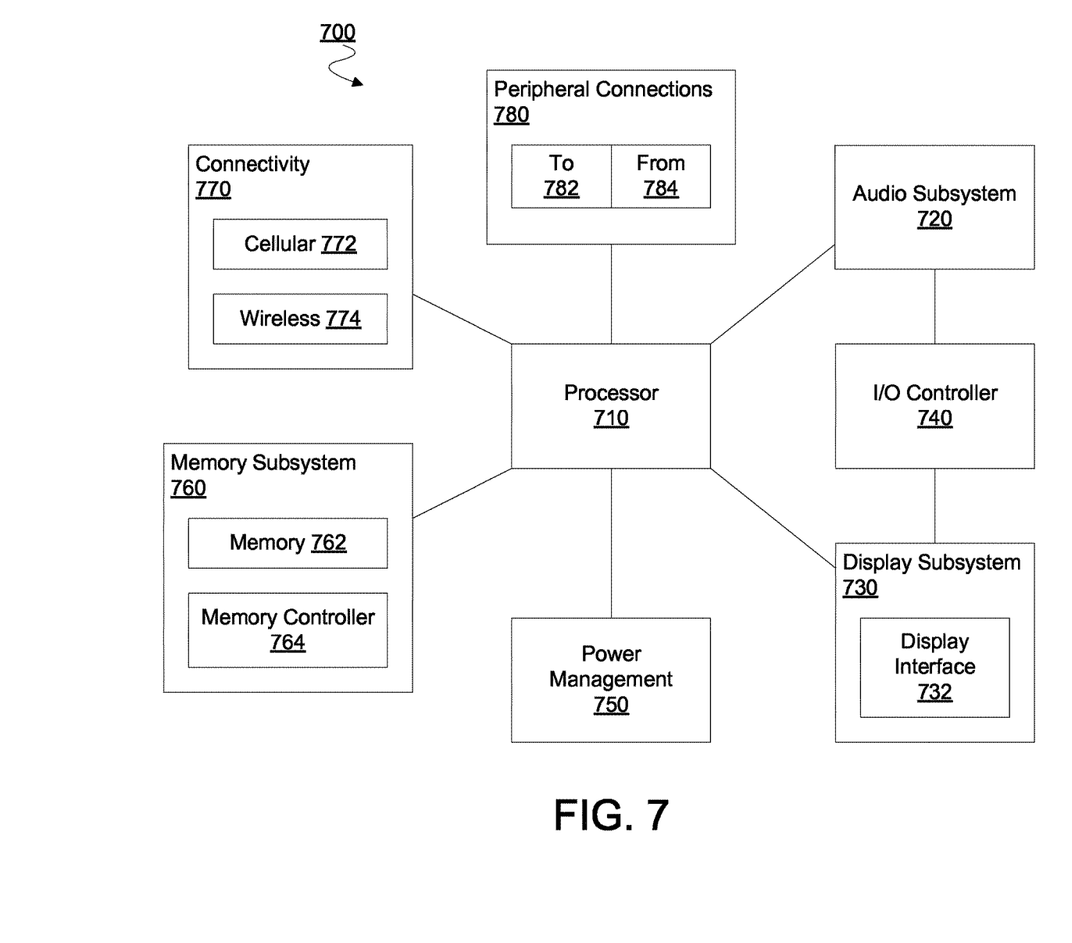
FIG. 7 is a block diagram illustrating elements of a mobile device for accessing memory resources according to an embodiment.

FIG. 7 is a block diagram of an embodiment of a mobile device in which memory accesses may be implemented—e.g. on a per-bit basis. Device 700 represents a mobile computing device, such as a computing tablet, a mobile phone or smartphone, a wireless-enabled e-reader, or other mobile device. It will be understood that certain of the components are shown generally, and not all components of such a device are shown in device 700.

Device 700 may include processor 710, which performs the primary processing operations of device 700. Processor 710 may include one or more physical devices, such as microprocessors, application processors, microcontrollers, programmable logic devices, or other processing means. The processing operations performed by processor 710 include the execution of an operating platform or operating system on which applications and/or device functions are executed. The processing operations include operations related to I/O (input/output) with a human user or with other devices, operations related to power management, and/or operations related to connecting device 700 to another device. The processing operations may also include operations related to audio I/O and/or display I/O.

In one embodiment, device 700 includes audio subsystem 720, which represents hardware (e.g., audio hardware and audio circuits) and software (e.g., drivers, codecs) components associated with providing audio functions to the computing device. Audio functions may include speaker and/or headphone output, as well as microphone input. Devices for such functions may be integrated into device 700, or connected to device 700. In one embodiment, a user interacts with device 700 by providing audio commands that are received and processed by processor 710.

Display subsystem 730 represents hardware (e.g., display devices) and software (e.g., drivers) components that provide a visual and/or tactile display for a user to interact with the computing device. Display subsystem 730 may include display interface 732, which may include the particular screen or hardware device used to provide a display to a user. In one embodiment, display interface 732 includes logic separate from processor 710 to perform at least some processing related to the display. In one embodiment, display subsystem 730 includes a touchscreen device that provides both output and input to a user.

I/O controller 740 represents hardware devices and software components related to interaction with a user. I/O controller 740 may operate to manage hardware that is part of audio subsystem 720 and/or display subsystem 730. Additionally, I/O controller 740 illustrates a connection point for additional devices that connect to device 700 through which a user might interact with the system. For example, devices that may be attached to device 700 might include microphone devices, speaker or stereo systems, video systems or other display device, keyboard or keypad devices, or other I/O devices for use with specific applications such as card readers or other devices.

As mentioned above, I/O controller 740 may interact with audio subsystem 720 and/or display subsystem 730. For example, input through a microphone or other audio device may provide input or commands for one or more applications or functions of device 700. Additionally, audio output may be provided instead of or in addition to display output. In another example, if display subsystem includes a touchscreen, the display device also acts as an input device, which may be at least partially managed by I/O controller 740. There may also be additional buttons or switches on device 700 to provide I/O functions managed by I/O controller 740.

In one embodiment, I/O controller 740 manages devices such as accelerometers, cameras, light sensors or other environmental sensors, gyroscopes, global positioning system (GPS), or other hardware that may be included in device 700. The input may be part of direct user interaction, as well as providing environmental input to the system to influence its operations (such as filtering for noise, adjusting displays for brightness detection, applying a flash for a camera, or other features).

In one embodiment, device 700 includes power management 750 that manages battery power usage, charging of the battery, and features related to power saving operation. Memory subsystem 760 may include memory device(s) 762 for storing information in device 700. Memory subsystem 760 may include nonvolatile (state does not change if power to the memory device is interrupted) and/or volatile (state is indeterminate if power to the memory device is interrupted) memory devices. Memory 760 may store application data, user data, music, photos, documents, or other data, as well as system data (whether long-term or temporary) related to the execution of the applications and functions of system 700.

In one embodiment, memory subsystem 760 includes memory controller 764 (which could also be considered part of the control of system 700, and could potentially be considered part of processor 710). Memory controller 764 monitors voltage swing characteristics of a bus. For example, memory controller 764 may detect different voltage swing characteristics for different signal lines of the same bus—e.g. a data bus. In an embodiment, memory controller 764 issues commands which cause memory 762 to internally generate an activate command or a precharge command for memory resources.

Connectivity 770 may include hardware devices (e.g., wireless and/or wired connectors and communication hardware) and software components (e.g., drivers, protocol stacks) to enable device 700 to communicate with external devices. The device could be separate devices, such as other computing devices, wireless access points or base stations, as well as peripherals such as headsets, printers, or other devices.

Connectivity 770 may include multiple different types of connectivity. To generalize, device 700 is illustrated with cellular connectivity 772 and wireless connectivity 774. Cellular connectivity 772 refers generally to cellular network connectivity provided by wireless carriers, such as provided via GSM (global system for mobile communications) or variations or derivatives, CDMA (code division multiple access) or variations or derivatives, TDM (time division multiplexing) or variations or derivatives, LTE (long term evolution—also referred to as "4G"), or other cellular service standards. Wireless connectivity 774 refers to wireless connectivity that is not cellular, and may include personal area networks (such as Bluetooth), local area networks (such as WiFi), and/or wide area networks (such as WiMax), or other wireless communication. Wireless communication refers to transfer of data through the use of modulated electromagnetic radiation through a non-solid medium. Wired communication occurs through a solid communication medium.

Peripheral connections 780 include hardware interfaces and connectors, as well as software components (e.g., drivers, protocol stacks) to make peripheral connections. It will be understood that device 700 could both be a peripheral device ("to" 782) to other computing devices, as well as have peripheral devices ("from" 784) connected to it. Device 700 commonly has a "docking" connector to connect to other computing devices for purposes such as managing (e.g., downloading and/or uploading, changing, synchronizing) content on device 700. Additionally, a docking connector may allow device 700 to connect to certain peripherals that allow device 700 to control content output, for example, to audiovisual or other systems.

In addition to a proprietary docking connector or other proprietary connection hardware, device 700 may make peripheral connections 780 via common or standards-based connectors. Common types may include a Universal Serial Bus (USB) connector (which may include any of a number of different hardware interfaces), DisplayPort including MiniDisplayPort (MDP), High Definition Multimedia Interface (HDMI), Firewire, or other type.

In one implementation, a memory device comprises detector logic to detect an exchange of a first multi-cycle command from a memory controller to the memory device, the first multi-cycle command indicating an access to a first bank of the memory device. The memory device further comprises control logic including circuitry configured to time, based on the detected exchange, an assertion of a second command during one or more cycles of a clock signal, the second command to perform one of an activation of the first bank and a refresh of the first bank, including the control logic to time a last cycle of the second command for a last sampling of the second command to begin during or after an expiration of a period of time from a beginning of a last cycle of the first multi-cycle command, wherein the period of time is equal to a predefined row precharge time delay parameter.

In an embodiment, the control logic is to time the last cycle of the second command for the last sampling of the second command to coincide with an earliest cycle of the clock signal to begin during or after the expiration of the period of time. In another embodiment, the second command is a multi-cycle command, wherein a total number of cycles of the first multi-cycle command is different than a total number of cycles of the second command. In another embodiment, the control logic to time the assertion includes the control logic to identify a reference time value for the beginning of the last cycle of the first multi-cycle command, and the control logic to determine a start time for the assertion of the second command, including the control logic to add to the reference time value a difference between the predefined row precharge time delay parameter and a duration of all cycles of the second command other than the last cycle of the second command. In another embodiment, the control logic is to generate the second command independent of any explicit command from the memory controller to perform the one of the activation of the first bank and the refresh of the first bank.

In another embodiment, the control logic is further to generate, in response to the detected exchange, a third command prior to the second command, the third command to perform a precharge operation. In another embodiment, the control logic is to generate the third command independent of any explicit command from the memory controller to perform the precharge operation. In another embodiment, the first multi-cycle command includes a hint value to indicate to the memory device whether the first bank includes a row which is currently open, wherein the control logic is to generate the third command in response to the hint value. In another embodiment, the control logic is to start an assertion of the third command at the beginning of the last cycle of the first multi-cycle command. In another embodiment, the first multi-cycle command includes an activation command, and wherein the second command is to perform the activation of the first bank. In another embodiment, the first multi-cycle command includes a refresh command, wherein the second command is to perform the refresh of the first bank. In another embodiment, the refresh command indicates that, of a plurality of banks of the memory device, only the first bank is to be refreshed. In another embodiment, the refresh command is to refresh all of a plurality of banks of the memory device.

In another implementation, a memory controller comprises command logic to exchange a first multi-cycle command from the memory controller to a memory device, the first multi-cycle command indicating an access to a first bank of the memory device. The memory controller further comprises timer logic to time, based on the detected exchange, a transmission of a second command to the memory device during one or more cycles of a clock signal, the second command to perform one of an activation of the first bank and a refresh of the first bank, including the timer logic to time a last cycle of the second command for a last sampling of the second command to begin during or after an expiration of a period of time from a beginning of a last cycle of the first multi-cycle command, wherein the period of time is equal to a predefined row precharge time delay parameter.

In an embodiment, the timer logic is to time the last cycle of the second command for the last sampling of the second command to coincide with an earliest cycle of the clock signal to begin during or after the expiration of the period of time. In another embodiment, the second command is a multi-cycle command, wherein a total number of cycles of the first multi-cycle command is different than a total number of cycles of the second command. In another embodiment, the timer logic to time the assertion includes the timer logic to identify a reference time value for the beginning of the last cycle of the first multi-cycle command, and the timer logic to determine a start time for the assertion of the second command, including the timer logic to add to the reference time value a difference between the predefined row precharge time delay parameter and a duration of all cycles of the second command other than the last cycle. In another embodiment, a plurality of memory banks of the memory device includes the first bank, wherein, of the plurality of banks, the first multi-cycle command indicates a precharge operation for only the first bank. In another embodiment, a plurality of memory banks of the memory device includes the first bank, wherein the first multi-cycle command indicates that all of the plurality of banks are to be precharged.

In another embodiment, the second command is to perform the activation of the first bank, wherein the timer logic is further to time an assertion of a multi-cycle column address strobe signal to the memory device subsequent to the second command, including the timer logic to time a last cycle of the multi-cycle column address strobe signal for a last sampling of the multi-cycle column address strobe signal to begin during or after an expiration of another period of time from a beginning of the last cycle of the second command, wherein the other period of time is equal to a predefined tRCD parameter specifying a required delay between an assertion of a row address strobe signal and an assertion of a column address strobe signal. In another embodiment, the last cycle of the multi-cycle column address strobe signal is timed for the last sampling of the multi-cycle column address strobe signal to coincide with an earliest cycle of the clock signal to begin during or after the expiration of the other period of time.

In another implementation, a method comprises detecting an exchange of a first multi-cycle command from a memory controller to a memory device, the first multi-cycle command indicating an access to a first bank of the memory device. The method further comprises, based on the detected exchange, timing an assertion of a second command during one or more cycles of a clock signal, the second command to perform one of an activation of the first bank and a refresh of the first bank, including timing a last cycle of the second command for a last sampling of the second command to begin during or after an expiration of a period of time from a beginning of a last cycle of the first multi-cycle command, wherein the period of time is equal to a predefined row precharge time delay parameter.

In an embodiment, the last cycle of the second command is timed for the last sampling of the second command to coincide with an earliest cycle of the clock signal to begin during or after the expiration of the period of time. In another embodiment, the second command is a multi-cycle command, wherein a total number of cycles of the first multi-cycle command is different than a total number of cycles of the second command. In another embodiment, timing the assertion includes identifying a reference time value for the beginning of the last cycle of the first multi-cycle command, and determining a start time for the assertion of the second command, including adding to the reference time value a difference between the predefined row precharge time delay parameter and a duration of all cycles of the second command other than the last cycle of the second command.

In another embodiment, detecting the exchange includes detecting at the memory device, wherein the memory device generates the second command independent of any explicit command from the memory controller to perform the one of the activation of the first bank and the refresh of the first bank. In another embodiment, the method further comprises, in response to detecting the exchange, generating a third command at the memory device prior to the second command, the third command to perform a precharge operation. In another embodiment, the third command is generated independent of any explicit command from the memory controller to perform the precharge operation. In another embodiment, the first multi-cycle command includes a hint value to indicate to the memory device whether the first bank includes a row which is currently open, wherein the memory device generates the third command in response to the hint value. In another embodiment, the memory device times an assertion of the third command to start at the beginning of the last cycle of the first multi-cycle command. In another embodiment, the first multi-cycle command includes an activation command, and wherein the second command is to perform the activation of the first bank. In another embodiment, the first multi-cycle command includes a refresh command, and wherein the second command is to perform the refresh of the first bank. In another embodiment, wherein the refresh command indicates that, of a plurality of banks of the memory device, only the first bank is to be refreshed. In another embodiment, the refresh command is to refresh all of a plurality of banks of the memory device.

In another embodiment, detecting the exchange includes detecting at the memory controller, wherein the memory controller sends the second command to the memory device. In another embodiment, a plurality of memory banks of the memory device includes the first bank, wherein, of the plurality of banks, the first multi-cycle command indicates a precharge operation for only the first bank. In another embodiment, a plurality of memory banks of the memory device includes the first bank, wherein the first multi-cycle command indicates that all of the plurality of banks are to be precharged. In another embodiment, the second command is to perform the activation of the first bank, and the method further comprises timing an assertion of a multi-cycle column address strobe signal to the memory device subsequent to the second command, including timing a last cycle of the multi-cycle column address strobe signal for a last sampling of the multi-cycle column address strobe signal to begin during or after an expiration of another period of time from a beginning of the last cycle of the second command, wherein the other period of time is equal to a predefined tRCD parameter specifying a required delay between an assertion of a row address strobe signal and an assertion of a column address strobe signal. In another embodiment, the last cycle of the multi-cycle column address strobe signal is timed for the last sampling of the multi-cycle column address strobe signal to coincide with an earliest cycle of the clock signal to begin during or after the expiration of the other period of time.

Techniques and architectures for operating a memory device are described herein. In the above description, for purposes of explanation, numerous specific details are set forth in order to provide a thorough understanding of certain embodiments. It will be apparent, however, to one skilled in the art that certain embodiments can be practiced without these specific details. In other instances, structures and devices are shown in block diagram form in order to avoid obscuring the description.

Reference in the specification to "one embodiment" or "an embodiment" means that a particular feature, structure, or characteristic described in connection with the embodiment is included in at least one embodiment of the invention. The appearances of the phrase "in one embodiment" in various places in the specification are not necessarily all referring to the same embodiment.

Some portions of the detailed description herein are presented in terms of algorithms and symbolic representations of operations on data bits within a computer memory. These algorithmic descriptions and representations are the means used by those skilled in the computing arts to most effectively convey the substance of their work to others skilled in the art. An algorithm is here, and generally, conceived to be a self-consistent sequence of steps leading to a desired result. The steps are those requiring physical manipulations of physical quantities. Usually, though not necessarily, these quantities take the form of electrical or magnetic signals capable of being stored, transferred, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise as apparent from the discussion herein, it is appreciated that throughout the description, discussions utilizing terms such as "processing" or "computing" or "calculating" or "determining" or "displaying" or the like, refer to the action and processes of a computer system, or similar electronic computing device, that manipulates and transforms data represented as physical (electronic) quantities within the computer system's registers and memories into other data similarly represented as physical quantities within the computer system memories or registers or other such information storage, transmission or display devices.

Certain embodiments also relate to apparatus for performing the operations herein. This apparatus may be specially constructed for the required purposes, or it may comprise a general purpose computer selectively activated or reconfigured by a computer program stored in the computer. Such a computer program may be stored in a computer readable storage medium, such as, but is not limited to, any type of disk including floppy disks, optical disks, CD-ROMs, and magnetic-optical disks, read-only memories (ROMs), random access memories (RAMs) such as dynamic RAM (DRAM), EPROMs, EEPROMs, magnetic or optical cards, or any type of media suitable for storing electronic instructions, and coupled to a computer system bus.

The algorithms and displays presented herein are not inherently related to any particular computer or other apparatus. Various general purpose systems may be used with programs in accordance with the teachings herein, or it may prove convenient to construct more specialized apparatus to perform the required method steps. The required structure for a variety of these systems will appear from the description herein. In addition, certain embodiments are not described with reference to any particular programming language. It will be appreciated that a variety of programming languages may be used to implement the teachings of such embodiments as described herein.

Besides what is described herein, various modifications may be made to the disclosed embodiments and implementations thereof without departing from their scope. Therefore, the illustrations and examples herein should be construed in an illustrative, and not a restrictive sense. The scope of the invention should be measured solely by reference to the claims that follow.

What is claimed is:

1. A memory device comprising:
    detector logic to detect an exchange of a first multi-cycle command from a memory controller to the memory device, the first multi-cycle command indicating an access to a first bank of the memory device;
    control logic including circuitry configured to time, based on the detected exchange, an assertion of a second command during one or more cycles of a clock signal, the second command to perform one of an activation of the first bank and a refresh of the first bank, including the control logic to time a last cycle of the second command to begin during or after an expiration of a first period of time from a beginning of a last cycle of the first multi-cycle command, wherein the first period of time is equal to a predefined row precharge time delay parameter, wherein a second period of time from a beginning of an earliest cycle of the first multi-cycle command to a beginning of an earliest cycle of the second command is to be less than the predefined row precharge time delay parameter, wherein the control logic to time the assertion includes:
        the control logic to identify a reference time value for the beginning of the last cycle of the first multi-cycle command; and
        the control logic to determine a start time for the assertion of the second command, including the control logic to add to the reference time value a difference between the predefined row precharge time delay parameter and a duration of all cycles of the second command other than the last cycle.

2. The memory device of claim 1, wherein the control logic to time the last cycle of the second command to coincide with an earliest cycle of the clock signal to begin during or after the expiration of the first period of time.

3. The memory device of claim 1, wherein the second command is a multi-cycle command, wherein a total number of cycles of the first multi-cycle command is different than a total number of cycles of the second command.

4. The memory device of claim 1, wherein the control logic to generate the second command independent of any explicit command, from the memory controller, to perform the one of the activation of the first bank and the refresh of the first bank.

5. The memory device of claim 4, the control logic further to generate, in response to the detected exchange, a third command prior to the second command, the third command to perform a precharge operation.

6. The memory device of claim 5, wherein the control logic to generate the third command independent of any explicit command from the memory controller to perform the precharge operation.

7. The memory device of claim 5, wherein the first multi-cycle command includes a hint value to indicate to the memory device whether the first bank includes a row which is currently open, wherein the control logic to generate the third command in response to the hint value.

8. The memory device of claim 5, wherein the control logic to start an assertion of the third command at the beginning of the last cycle of the first multi-cycle command.

9. A memory controller comprising:
    command logic to exchange a first multi-cycle command from the memory controller to a memory device, the first multi-cycle command indicating an access to a first bank of the memory device;
    timer logic to time, based on the detected exchange, a transmission of a second command to the memory device during one or more cycles of a clock signal, the second command to perform one of an activation of the first bank and a refresh of the first bank, including the timer logic to time a last cycle of the second command to begin during or after an expiration of a first period of time from a beginning of a last cycle of the first multi-cycle command, wherein the first period of time is equal to a predefined row precharge time delay parameter, wherein a second period of time from a beginning of an earliest cycle of the first multi-cycle command to a beginning of an earliest cycle of the second command is to be less than the predefined row precharge time delay parameter, wherein the second command is to perform the activation of the first bank, wherein the timer logic is further to time an assertion of a multi-cycle column address strobe signal to the memory device subsequent to the second command, including the timer logic to time a last cycle of the multi-cycle column address strobe signal for a last sampling of the multi-cycle column address strobe signal to begin during or after an expiration of another period of time from a beginning of the last cycle of the second command, wherein the other period of time is equal to a predefined tRCD parameter specifying a required delay between an assertion of a row address strobe signal and an assertion of a column address strobe signal.

10. The memory controller of claim 9, wherein the timer logic to time the last cycle of the second command to coincide with an earliest cycle of the clock signal to begin during or after the expiration of the first period of time.

11. The memory controller of claim 9, wherein the second command is a multi-cycle command, wherein a total number of cycles of the first multi-cycle command is different than a total number of cycles of the second command.

12. The memory controller of claim 9, wherein the last cycle of the multi-cycle column address strobe is timed to coincide with an earliest cycle of the clock signal to begin during or after the expiration of the other period of time.

13. A method comprising:
    detecting an exchange of a first multi-cycle command from a memory controller to a memory device, the first multi-cycle command indicating an access to a first bank of the memory device;
    based on the detected exchange, timing an assertion of a second command during one or more cycles of a clock signal, the second command to perform one of an activation of the first bank and a refresh of the first bank, including timing a last cycle of the second command to begin during or after an expiration of a first period of time from a beginning of a last cycle of the first multi-cycle command, wherein the first period of time is equal to a predefined row precharge time delay parameter, wherein a second period of time from a beginning of an earliest cycle of the first multi-cycle command to a beginning of an earliest cycle of the second command is less than the predefined row precharge time delay parameter, wherein timing the assertion includes:

identifying a reference time value for the beginning of the last cycle of the first multi-cycle command, and determining a start time for the assertion of the second command, including adding to the reference time value a difference between the predefined row precharge time delay parameter and a duration of all cycles of the second command other than the last cycle.

14. The method of claim 13, wherein the last cycle of the second command is timed to coincide with an earliest cycle of the clock signal to begin during or after the expiration of the first period of time.

15. The method of claim 13, wherein the second command is a multi-cycle command, wherein a total number of cycles of the first multi-cycle command is different than a total number of cycles of the second command.

16. The method of claim 13, wherein detecting the exchange includes detecting at the memory device, wherein the memory device generates the second command independent of any explicit command from the memory controller to perform the one of the activation of the first bank and the refresh of the first bank.

17. The method of claim 16, further comprising, in response to detecting the exchange, generating a third command at the memory device prior to the second command, the third command to perform a precharge operation.

18. The method of claim 13, wherein detecting the exchange includes detecting at the memory controller, wherein the memory controller sends the second command to the memory device.

19. The method of claim 18, wherein a plurality of memory banks of the memory device includes the first bank, and wherein, of the plurality of banks, the first multi-cycle command indicates a precharge operation for only the first bank.

20. The method of claim 18, wherein a plurality of memory banks of the memory device includes the first bank, and wherein the first multi-cycle command indicates that all of the plurality of banks are to be precharged.

21. The method of claim 18, wherein the second command is to perform the activation of the first bank, the method further comprising:

timing an assertion of a multi-cycle column address strobe signal to the memory device subsequent to the second command, including timing a last cycle of the multi-cycle column address strobe signal to begin during or after an expiration of another period of time from a beginning of the last cycle of the second command, wherein the other period of time is equal to a predefined tRCD parameter specifying a required delay between an assertion of a row address strobe signal and an assertion of a column address strobe signal.

22. The method of claim 21, wherein the last cycle of the multi-cycle column address strobe signal is timed to coincide with an earliest cycle of the clock signal to begin during or after the expiration of the other period of time.

* * * * *